(12) United States Patent
Seo et al.

(10) Patent No.: US 10,008,462 B2
(45) Date of Patent: Jun. 26, 2018

(54) SEMICONDUCTOR PACKAGE

(71) Applicant: Samsung Electronics Co., Ltd., Suwon-si (KR)

(72) Inventors: Sun-kyoung Seo, Suwon-si (KR); Tae-je Cho, Yongin-si (KR); Yong-hwan Kwon, Suwon-si (KR); Hyung-gil Baek, Suwon-si (KR); Hyun-soo Chung, Hwaseong-si (KR); Seung-kwan Ryu, Seongnam-si (KR); Myeong-soon Park, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/226,231

(22) Filed: Aug. 2, 2016

(65) Prior Publication Data

US 2017/0084558 A1 Mar. 23, 2017

(30) Foreign Application Priority Data

Sep. 18, 2015 (KR) ........................ 10-2015-0132601

(51) Int. Cl.
| | |
|---|---|
| *H01L 21/00* | (2006.01) |
| *H01L 23/00* | (2006.01) |
| *H01L 23/31* | (2006.01) |
| *H01L 23/29* | (2006.01) |

(52) U.S. Cl.
CPC ............ *H01L 24/08* (2013.01); *H01L 23/291* (2013.01); *H01L 23/3171* (2013.01); *H01L 24/13* (2013.01); *H01L 2224/0401* (2013.01); *H01L 2224/05582* (2013.01); *H01L 2224/08058* (2013.01)

(58) Field of Classification Search
CPC ............ H01L 24/08; H01L 2224/0401; H01L 2224/08058
See application file for complete search history.

(56) References Cited

U.S. PATENT DOCUMENTS

| | | |
|---|---|---|
| 5,937,320 A | 8/1999 | Andricacos et al. |
| 6,563,216 B1 | 5/2003 | Kimura et al. |
| 7,176,583 B2 | 2/2007 | Daubenspeck et al. |

(Continued)

FOREIGN PATENT DOCUMENTS

| | | |
|---|---|---|
| JP | 4021104 | 12/2007 |
| JP | 2008160168 | 10/2008 |

(Continued)

*Primary Examiner* — Laura Menz
(74) *Attorney, Agent, or Firm* — Onello & Mello LLP

(57) ABSTRACT

A semiconductor package includes a semiconductor substrate and an electrode pad formed on the semiconductor substrate. The electrode pad includes a central portion and a peripheral portion, and a first pattern is located on the peripheral portion. A passivation layer is formed on the semiconductor substrate and the electrode pad. The passivation layer has an opening exposing the central portion of the electrode pad and a second pattern located on the first pattern. A seed layer is formed on the electrode pad and the passivation layer. The seed layer has a third pattern formed on the second pattern. A bump is formed on the seed layer and electrically connected to the electrode pad. An undercut is formed around the third pattern located under an edge of a lower portion of the bump.

9 Claims, 24 Drawing Sheets

(56) References Cited

U.S. PATENT DOCUMENTS

| | | | |
|---|---|---|---|
| 7,713,860 B2 * | 5/2010 | Yu | H01L 23/3171 257/673 |
| 7,713,861 B2 * | 5/2010 | Yu | H01L 24/03 257/673 |
| 7,728,431 B2 * | 6/2010 | Harada | H01L 24/03 257/750 |
| 8,022,530 B2 * | 9/2011 | Shih | H01L 23/49811 257/690 |
| 8,298,930 B2 | 10/2012 | Arvin et al. | |
| 8,492,892 B2 * | 7/2013 | Daubenspeck | H01L 24/03 257/737 |
| 8,508,043 B2 * | 8/2013 | Daubenspeck | H01L 23/3171 257/459 |
| 8,587,120 B2 | 11/2013 | Choi et al. | |
| 8,647,974 B2 * | 2/2014 | Topacio | H01L 24/03 257/766 |
| 8,963,331 B2 * | 2/2015 | Zhang | H01L 23/53238 257/758 |
| 9,018,757 B2 * | 4/2015 | Tsai | H01L 24/13 257/684 |
| 9,035,455 B2 * | 5/2015 | Sameshima | H01L 23/525 257/737 |
| 9,219,010 B2 * | 12/2015 | Seddon | H01L 24/11 |
| 9,224,688 B2 * | 12/2015 | Chuang | H01L 24/05 |
| 9,349,665 B2 * | 5/2016 | Chen | H01L 24/05 |
| 9,349,700 B2 * | 5/2016 | Hsieh | H01L 24/13 |
| 9,391,036 B2 * | 7/2016 | Matsumoto | H01L 24/11 |
| 9,607,957 B2 * | 3/2017 | Sameshima | H01L 24/08 |
| 9,711,438 B2 * | 7/2017 | Lin | H01L 24/11 |
| 2007/0290343 A1 * | 12/2007 | Harada | H01L 24/03 257/737 |
| 2008/0157362 A1 | 7/2008 | Chang et al. | |
| 2008/0169559 A1 | 7/2008 | Yang | |
| 2009/0032942 A1 | 2/2009 | Choi | |
| 2012/0064712 A1 | 3/2012 | Lei et al. | |
| 2012/0098124 A1 | 4/2012 | Wu et al. | |
| 2012/0139113 A1 | 6/2012 | Arvin et al. | |
| 2013/0012014 A1 | 1/2013 | Lei et al. | |
| 2015/0037936 A1 | 2/2015 | Shen et al. | |
| 2016/0351473 A1 * | 12/2016 | Uchida | H01L 23/481 |
| 2017/0084558 A1 * | 3/2017 | Seo | H01L 24/08 |

FOREIGN PATENT DOCUMENTS

| | | | |
|---|---|---|---|
| KR | 1020070082998 | 8/2007 | |
| KR | 1020140030902 | 3/2014 | |
| KR | 20170034211 A * | 3/2017 | H01L 24/08 |

* cited by examiner (a)

(b)

SEMICONDUCTOR PACKAGE

CROSS-REFERENCE TO RELATED APPLICATION

This U.S. non-provisional application claims priority under 35 USC § 119 to Korean Patent Application No. 10-2015-0132601, filed on Sep. 18, 2015, in the Korean Intellectual Property Office, the contents of which are herein incorporated by reference in their entirety.

BACKGROUND

Some embodiments of the present inventive concepts relate to a semiconductor package, and, more particularly, to a semiconductor package including a seed layer having a curved portion and located under a bump.

A demand for portable devices has rapidly increased. As a result, it is necessary to downscale and reduce a weight of electronic components mounted in portable devices. In order to manufacture lightweight, downscaled electronic components, there is a tendency to decrease the thickness of a semiconductor package. Also, there is a need to increase the memory capacity of a semiconductor package. In order to embody high-capacity memory in a limited structure of a semiconductor package, small-sized external connection terminals may be required. Thus, there is a tendency to downscale bumps formed in the semiconductor package.

SUMMARY

Example embodiments of the present inventive concepts provide a semiconductor package including a seed layer having a curved portion and located under a bump, so that an undercut may be minimized.

According to an aspect of the present inventive concepts, there is provided a semiconductor package including a semiconductor substrate and an electrode pad on the semiconductor substrate. The electrode pad includes a central portion and a peripheral portion. A first pattern is located on the peripheral portion. A passivation layer is on the semiconductor substrate and the electrode pad. The passivation layer has an opening exposing the central portion of the electrode pad and a second pattern located on the first pattern. A seed layer is on the electrode pad and the passivation layer. The seed layer has a third pattern on the second pattern. A bump is formed on the seed layer and electrically connected to the electrode pad. An undercut is formed in the third pattern located under an edge of a lower portion of the bump.

In some embodiments, the bump may include a pillar layer being in contact with the seed layer and a solder layer on the pillar layer.

In some embodiments, a top surface of the pillar layer may be a flat surface, and a bottom surface of the pillar layer may include a curved surface corresponding to the third pattern.

In some embodiments, a distance from a center of the pillar layer to a side surface of the pillar layer may be greater than a distance from a center of the seed layer to a side surface of the seed layer.

In some embodiments, in the electrode pad, the first pattern may be spaced apart from the central portion and surrounds the central portion. A top surface of the first pattern may be at the same level as a top surface of the central portion.

In some embodiments, the first pattern may be a plurality of isolated fine patterns. A width of each of the fine patterns may be substantially equal to a distance between the fine patterns.

In some embodiments, in the electrode pad, the first pattern may be connected to the central portion, and a top surface of the first pattern may be a curved surface.

In some embodiments, the second pattern may have a shape corresponding to the first pattern, and the third pattern may have a shape corresponding to the second pattern.

In some embodiments, in the passivation layer, the opening may be surrounded by the second pattern.

In some embodiments, the passivation layer may be a silicon oxide layer or a silicon nitride layer.

According to another aspect of the present inventive concepts, there is provided a semiconductor package including a semiconductor substrate having an electrode pad exposed by a passivation layer. A redistribution is on the electrode pad and the passivation layer. The redistribution is electrically connected to the electrode pad. The redistribution has a first pattern in a region spaced apart from the electrode pad. An insulating layer is on the redistribution and the passivation layer. The insulating layer has an opening exposing a portion of the redistribution and a second pattern on the first pattern. A seed layer is on the redistribution and the insulating layer. The seed layer has a third pattern on the second pattern. A bump is on the seed layer and electrically connected to the redistribution. An undercut is formed in the third pattern located under an edge of a lower portion of the bump.

In some embodiments, the second pattern may have substantially a same top profile as the third pattern.

In some embodiments, a top surface of the redistribution exposed by the opening may be a flat surface.

In some embodiments, in the insulating layer, the opening may be surrounded by the second pattern.

In some embodiments, the insulating layer may be a silicon oxide layer or a silicon nitride layer.

In some embodiments, a semiconductor package includes a semiconductor substrate, and an electrode pad on the semiconductor substrate and including a central portion and a peripheral portion. A first pattern is located on the peripheral portion. The semiconductor package further includes a passivation layer on the semiconductor substrate and the electrode pad. The passivation layer has an opening exposing the central portion of the electrode pad and a second pattern located on the first pattern and surrounding the opening exposing the central portion of the electrode pad. The semiconductor package further includes a seed layer on the electrode pad and the passivation layer and having a third pattern on the second pattern and a bump on the seed layer and electrically connected to the electrode pad. An undercut is formed under the bump and a distance from a center of the bump to a side surface of the bump is greater than a distance from a center of the seed layer to a side surface of the seed layer.

In some embodiments, the first pattern, the second pattern, the third pattern and a bottom surface of the bump have curved surfaces.

In some embodiments, the undercut is formed by removing a portion of the third pattern.

In some embodiments, the bump comprises a pillar layer being in contact with the seed layer and a solder layer on the pillar layer.

In some embodiments, a top surface of the pillar layer is a flat surface, and a bottom surface of the pillar layer is a curved surface corresponding to the third pattern.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1A:
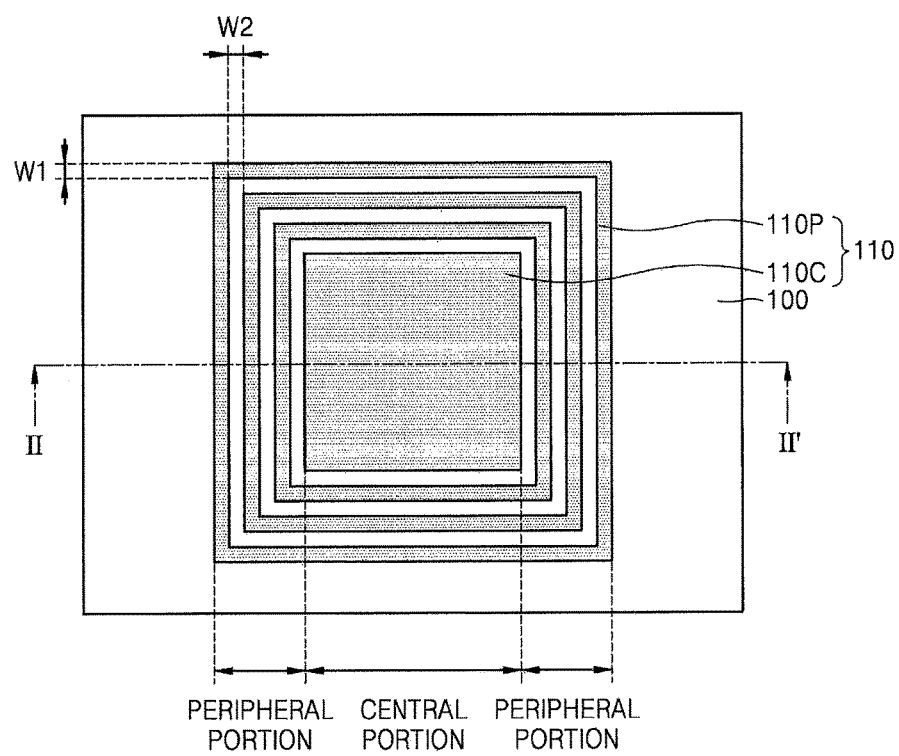
FIGS. 1A and 1B are plan views of an electrode pad included in a semiconductor package according to some example embodiments of the present inventive concepts.

Various example embodiments will now be described more fully hereinafter with reference to the accompanying drawings, in which some example embodiments of the present inventive concepts are shown. The present inventive concepts may, however, be embodied in many different forms and should not be construed as limited to the example embodiments set forth herein.

As used herein, the term "and/or" includes any and all combinations of one or more of the associated listed items. Like numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, a first element, component, region, layer and/or section discussed below could be termed a second element, component, region, layer and/or section without departing from the teachings of the inventive concepts.

The terminology used herein is for the purpose of describing particular example embodiments only and is not intended to be limiting of the present inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device.

The plurality of device structures may be arranged in an array and/or in a two-dimensional pattern.

Figure 1B:
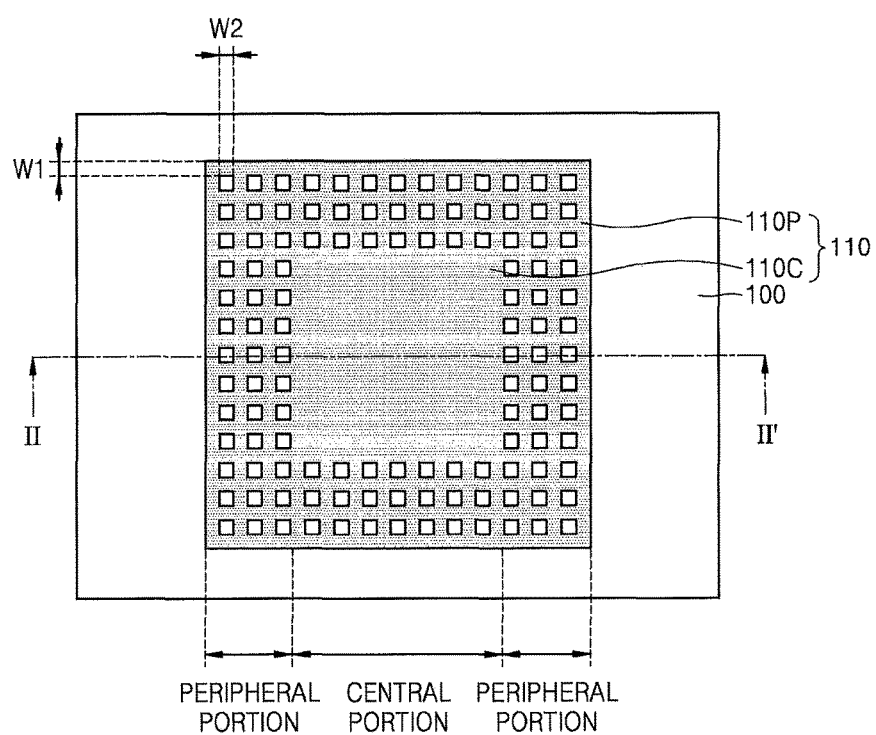
Figure 2:
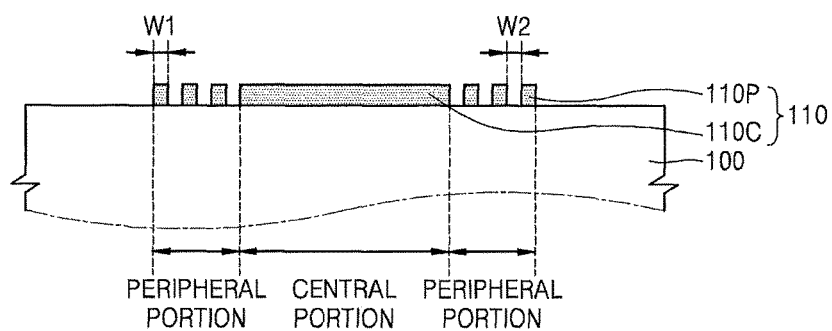
FIGS. 2 to 9 are cross-sectional views illustrating a method of manufacturing a semiconductor package according to some example embodiments of the present inventive concepts.

FIGS. 1A and 1B are plan views and FIG. 2 is a cross-sectional view illustrating an electrode pad according to some example embodiments of the present inventive concepts. Specifically, FIG. 2 is a cross-sectional view taken along a line II-II' of FIGS. 1A and 1B.

Referring to FIGS. 1A, 1B, and 2, an electrode pad 110 may be disposed on a semiconductor substrate 100. The electrode pad 110 may externally expand a function of a circuit included in a semiconductor device. The semiconductor substrate 100 may be, for example, a semiconductor wafer substrate including, for example, a plurality of semiconductor chips, which are arranged as a matrix type and divided from one another by a scribe line (not shown).

A circuit portion may be formed in the semiconductor substrate 100 by using a semiconductor manufacturing process. The circuit portion may include, for example, discrete unit devices. That is, a transistor(s), a resistor(s), a capacitor(s), a conductive interconnection(s), and an insulating layer(s) located among the transistor(s), the resistor(s), the capacitor(s), and the conductive interconnection(s) may be formed in the semiconductor substrate 100.

Various semiconductor devices, for example, a memory device, for example, dynamic random access memory (DRAM), flash memory, or the like, a logic device, for example, a microprocessor (MP)), an analog device, a digital signal processor (DSP) device, a system-on chip (SOC) device, a combination thereof or the like, may be formed on the semiconductor substrate 100.

The electrode pad 110 may be electrically connected to the circuit portion of the semiconductor device so that the semiconductor device may be electrically connected to an external device. A plurality of electrode pads 110 via which electric signals are input/output to and from the semiconductor substrate 100 may be provided on the semiconductor substrate 100. The plurality of electrode pads 110 may include a metal having a low resistivity, for example, aluminum (Al) and copper (Cu).

The electrode pad 110 may be electrically connected to a metal interconnection located thereunder through a via. The formation of the electrode pad 110 may include depositing a metal, for example, aluminum (Al), on the semiconductor substrate 100 to a predetermined thickness and performing a photolithography process and an etching process to obtain a desired shape of the electrode pad 110. Since the photolithography process and the etching process are typical processes, detailed descriptions thereof are omitted.

In some embodiments, the electrode pad 110 having a central portion and a peripheral portion may be formed by using a photolithography process and an etching process. A central pattern 110C may be formed in the central portion of the electrode pad 110 and electrically connected to the via thereunder. The central pattern 110C may have the same shape as a typical electrode pad. Although the central pattern 110C is illustrated as having a regular tetragonal shape, the central pattern 110C is not limited thereto. For example, the central pattern 110c may have a polygonal shape, such as a tetragonal shape, a hexagonal shape, or an octagonal shape, a circular shape, or an elliptical shape. The central pattern 110C may have at least a predetermined size in order to resist electrical or mechanical stress.

A first pattern 110P may be formed in the peripheral portion of the electrode pad 110 and surround the central pattern 110C. The first pattern 110P may include a plurality of fine patterns. While the first pattern 110P is illustrated as having a regular tetragonal shape, the first pattern 110P is not limited thereto. For example, the first pattern 110P may have a polygonal shape, such as a tetragonal shape, a hexagonal shape, or an octagonal shape, a circular shape, or an elliptical shape, according to the shape of the central pattern 110C. The first pattern 110P may have a predetermined width W1. A distance W2 between first patterns 110P may be substantially the same as a width W1 of the first patterns 110P. However, the present inventive concepts are not limited thereto, and the width W1 of the first patterns 110P and the distance W2 between the first patterns 110P may vary according to a shape of a third pattern, for example, third pattern 130P in FIG. 4, to be formed.

As illustrated in FIG. 1A, the central pattern 110C and the first pattern 110P may be formed spaced apart from each other. Also, the first patterns 110P may be formed spaced apart from one another.

As illustrated in FIG. 1B, the first pattern 110P may have a checked shape. In such an embodiment, the first pattern 110P may be electrically connected to the central pattern 110C and includes a large number of curved patterns formed per unit area, bonding strength may increase so that stress applied to the bump, for example, bump structure 145R in FIG. 9, may be reduced. That is, the central pattern 110C may contact the first pattern 110P.

FIGS. 3 to 9 are cross-sectional views of a method of manufacturing a semiconductor package using the semiconductor substrate, for example, semiconductor substrate 100 in FIG. 1A, having the electrode pad, for example, electrode pad 110 in FIG. 1A, according to some example embodiments of the present inventive concepts.

Figure 3:
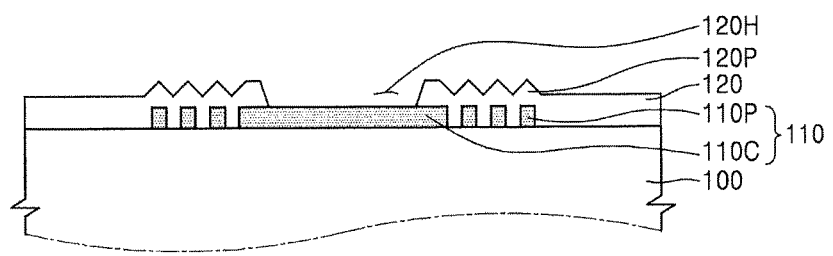

Referring to FIG. 3, a passivation layer 120 may be formed on the electrode pad 110 and the semiconductor substrate 100. The passivation layer 120 may include an opening 120H and a second pattern 120P. The opening 120H may expose a portion of the central pattern 110C of the electrode pad 110, and the second pattern 120P may be formed on the first pattern 110P of the electrode pad 110. The passivation layer 120 may be formed on a portion of the central pattern 110C, for example, an edge portion of the central pattern 110C, on the first pattern 110P, in the openings between the second patterns 110P and in the opening between the central pattern 110C and the first pattern 110P.

The exposed portion of the central pattern 110C of the electrode pad 110 may be exposed by the passivation layer 120. The passivation layer 120 is a final protection layer of the circuit portion of the semiconductor device. The electrode pad 110 may be electrically connected to the circuit portion of the semiconductor device through the via thereunder, and an exposed portion of the electrode pad 110, that is, the exposed portion of the central pattern 110C, may be electrically connected to an external device through an external connection terminal.

The opening 120H may have the same size as in a typical electrode pad. Since the electrode pad 110 according to the present example embodiment includes the first pattern 110P formed in the peripheral portion thereof, the passivation layer 120 may have the second pattern 120P formed along a top profile of the first pattern 110P.

The opening 120H in the passivation layer 120 may be surrounded by the second pattern 120P. That is, during a process of foaming the passivation layer 120, the passivation layer 120 may be formed in such an appropriate position that the opening 120H may expose the portion of the central pattern 110C of the electrode pad 110 and be surrounded by the second pattern 120P.

The passivation layer 120 may be formed along exposed regions of the substrate 100 and on the electrode pad 110 on the semiconductor substrate 100 except for the exposed portion of the central pattern 110C. Thus, the semiconductor substrate 100 may be insulated in the regions except the electrode pad 110 through hole 120I1 along the central pattern 110C. Also, the passivation layer 120 may serve to protect a top surface of the semiconductor substrate 100 from external impurities and physical impact. The passivation layer 120 may include a plurality of layers.

In general, the passivation layer 120 may include, for example, one material selected from the group consisting of silicon oxide, silicon nitride, polyimide (PI), benzocyclobutene (BCB), polybenzoxaxole (PBO), bismaleimide triazine (BT), phenolic resin, an epoxy, or the like.

In this example embodiment, since the passivation layer 120 includes the second pattern 120P, the passivation layer 120 may include, for example, a silicon oxide layer or a silicon nitride layer. A silicon-based insulating layer may have good insulating characteristics and be formed based on a shape of an underlying layer. Accordingly, the passivation layer 120 may have the second pattern 120P having a shape corresponding to a shape of the first pattern 110P. A profile of the second pattern 120P may be substantially the same as or approximately similar to a profile of the first pattern 110P. The shape of the second pattern 120P may vary according to materials, process conditions, and subsequent processes.

Figure 4:
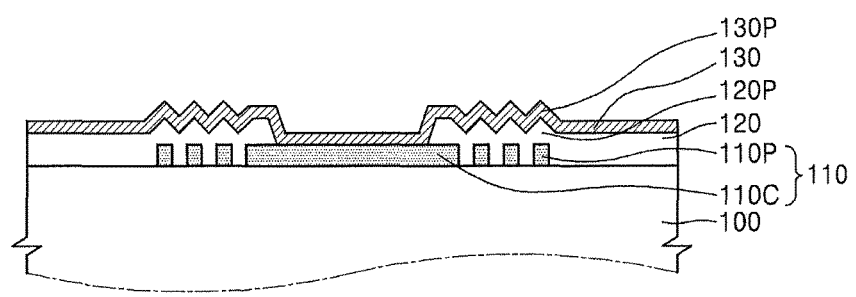

Referring to FIG. 4, a seed layer 130 may be formed on the electrode pad 110 and the passivation layer 120. The seed layer 130 may be formed on the exposed surfaces of the electrode pad 110, that is, the central pattern 110C exposed by opening 120I1, and the passivation layer 120. The seed layer 130 may be formed by, for example, using a chemical vapor deposition (CVD) process or a physical vapor deposition (PVD) process to a thickness of about 100 Å to about 0.5 μm. The seed layer 130 may include, for example, a metal, such as copper (Cu), nickel (Ni), titanium (Ti), tungsten (W), tin (Sn), silver (Ag), or an alloy thereof. The seed layer 130 may be a single layer or a multilayered structure.

Figure 6:
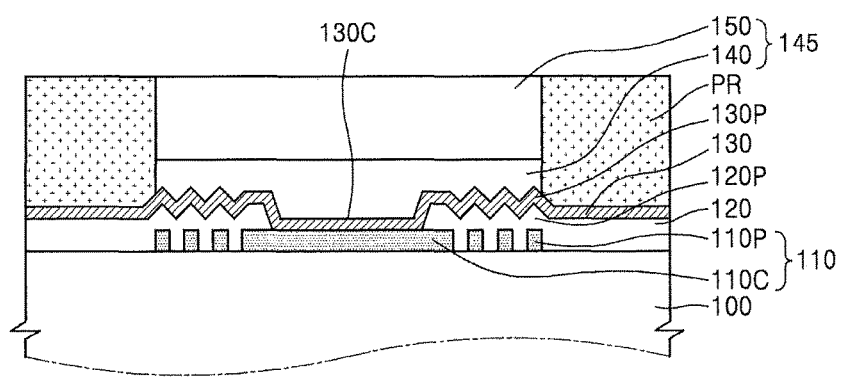

The seed layer 130 may function as a seed for forming a bump structure, for example, bump structure 145 in FIG. 6. That is, when the bump structure 145 is formed by using an electroplating process, the seed layer 130 may provide a current path so that the bump structure 145 may be formed on the seed layer 130.

The seed layer 130 may include a third pattern 130P formed on the second pattern 120P of the passivation layer 120. A top surface of the third pattern 130P may have substantially the same profile as a top surface of the second pattern 120P. Also, the seed layer 130 may substantially planarly cover the entire opening 120H of the passivation layer 120. That is, the third pattern 130P may not be fonned on a region in contact with the electrode pad 110. Thus, the third pattern 130P surrounds the opening 120H and does not contact the exposed portion of the central pattern 110C exposed through opening 120H.

Figure 5:
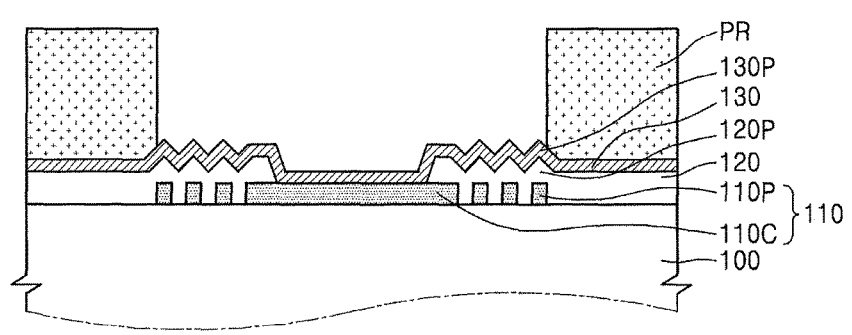

Referring to FIG. 5, a photoresist pattern PR may be formed on the seed layer 130. The photoresist pattern PR may expose a portion of the seed layer 130.

The exposed portion of the seed layer 130 may include a portion of the seed layer 130, which is in contact with the electrode pad 110, and the third pattern 130P. That is, the substantially planar portion of the seed layer 130 covering the opening 120H of the passivation layer 120 and the third pattern 130P are exposed by the photoresist pattern PR. Since a portion of the seed layer 130 exposed by the photoresist pattern PR corresponds to a portion in which a bump structure, for example, bump structure 145 in FIG. 6, will be formed in a subsequent process, when a plurality of electrode pads 110 are formed, a plurality of portions may be exposed by the photoresist pattern PR which correspond to the respective electrode pads 110. A portion exposed by the photoresist pattern PR may be referred to as a ball land.

Referring to FIG. 6, a double structure including a pillar layer 140 and a solder layer 150 may be formed on the seed layer 130 on which the photoresist pattern PR is formed. However, the present inventive concepts are not limited thereto. For example, a single structure including the solder layer 150 may be formed on the seed layer 130 on which the photoresist pattern PR is formed. The pillar layer 140 and the solder layer 150 may form bump structure 145.

The pillar layer 140 may be formed on an exposed top surface of the seed layer 130 which is exposed by the photoresist pattern PR. The pillar layer 140 may be formed by, for example, using an electroplating process. The electroplating process for forming the pillar layer 140 may be referred to as a first electroplating process.

A thickness of a portion of the pillar layer 140 formed on a region 130C of the seed layer 130 in contact with the central pattern 110C of the electrode pad 110 may be different from a thickness of a portion of the pillar layer 140 formed on the third pattern 130P of the seed layer 130. A bottom surface of the pillar layer 140 may have a shape corresponding to a top profile of the third pattern 130P along the third pattern 130P and a shape corresponding to a top profile of the region 130C along the region 130C. In contrast, a top surface of the pillar layer 140 may be a flat surface.

To form the pillar layer 140, the semiconductor substrate 100 on which the photoresist pattern PR is formed may be put in a bath, and a first electroplating process may be performed. The pillar layer 140 may be, for example, a single layer including, for example, a metal selected out of copper (Cu), nickel (Ni), and gold (Au), or an alloy thereof, or a multilayered structure including, for example, at least two metals selected out of copper (Cu), nickel (Ni), and gold (Au).

The pillar layer 140 may partially fill, that is, not completely, a region exposed by the photoresist pattern PR. That is, the pillar layer 140 may be formed to a smaller thickness than a thickness of the photoresist pattern PR.

The solder layer 150 may be formed on the pillar layer 140. A top surface of the solder layer 150 may be coplanar with or protrude over a top surface of the photoresist pattern PR. The solder layer 150 may be formed by using an electroplating process. To distinguish from the first electroplating process for forming the pillar layer 140, the electroplating process for forming the solder layer 150 may be referred to as a second electroplating process.

In order to form the solder layer 150, the semiconductor substrate 100 on which the pillar layer 140 is formed may be put into a bath that is different from the bath used in the first electroplating process, and a second electroplating process may be performed. The solder layer 150 may be, for example, an alloy of tin (Sn) and silver (Ag), and small amounts of, for example, copper (Cu), palladium (Pd), bismuth (Bi), and/or antimony (Sb) may be added to the solder layer 150.

Figure 7:
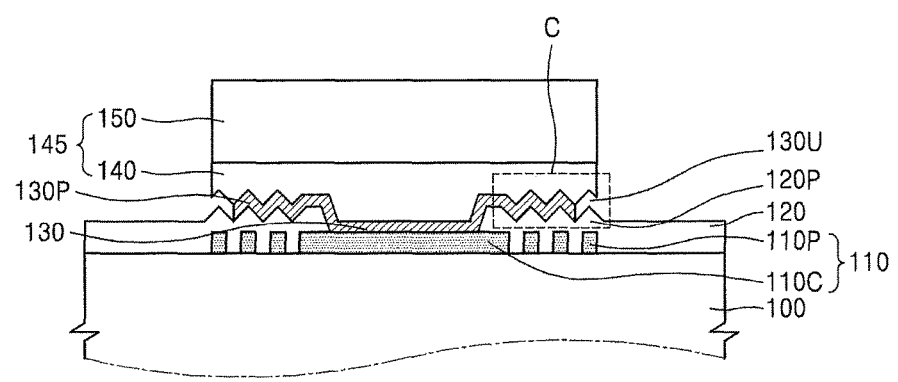

Referring to FIG. 7, the photoresist pattern, for example, photoresist pattern PR in FIG. 6, may be removed, and a portion of the seed layer 130 may be removed. For example, the portion of the seed layer 130 under the photoresist pattern PR and a portion of the seed layer 130 under the pillar layer 140, that is undercut 130U, may be removed.

The photoresist pattern PR may be removed by using a strip process or an ashing process. After the photoresist pattern PR is removed, the exposed seed layer 130 may be wet etched by using the pillar layer 140 and the solder layer 150 as an etch mask. When the seed layer 130 is wet etched by using an isotropic etching process, the undercut 130U may be formed in a lower portion of the pillar layer 140.

When a material included in the seed layer 130 is copper (Cu), the seed layer 130 may be removed by an ammoniacal etching process. For example, the seed layer may be removed by using alkaline etchants including, for example, $Cu(NH_3)_4Cl_2$, $Cu(NH_3)_2Cl$, $NH_3$, and $NH_4Cl$. Thereafter, chemicals containing CuO, which are obtained as a result of the etching process, may be cleaned by using, for example, NH3 and water ($H_2O$).

The undercut 130U may be formed under the bump structure 145 by etching a side surface of the seed layer 130. The undercut 130U may extend under the bump structure 145 to a length of about several μm, for example more than 2 μm. Since the undercut 130U is formed by removing a portion of the third pattern 130P under the pillar layer 140, the undercut 130U may have the same shape as the third pattern 130P. That is, the undercut 130U may have a curved surface unlike a typical undercut.

Due to the undercut 130U, a distance from a center of the pillar layer 140 to a side surface of the pillar layer 140 may be greater than a distance from a center of the seed layer 130 to the side surface of the seed layer 130. That is, a lower edge of the pillar layer 140 may include an exposed region, which is out of contact with the seed layer 130. That is, a lower edge of the pillar layer 140 and an upper surface of the third pattern 130P may be exposed by the undercut 130U.

Figure 8:
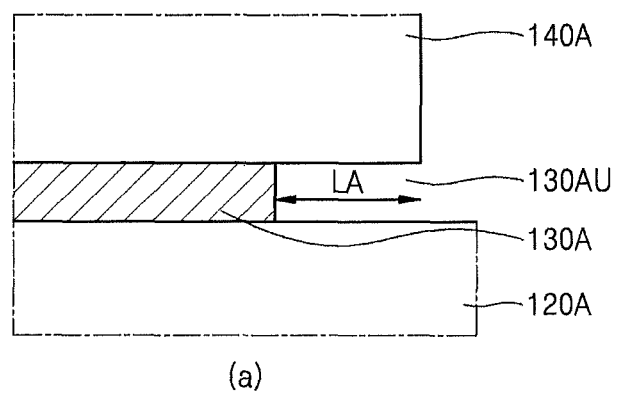
Figure 8:
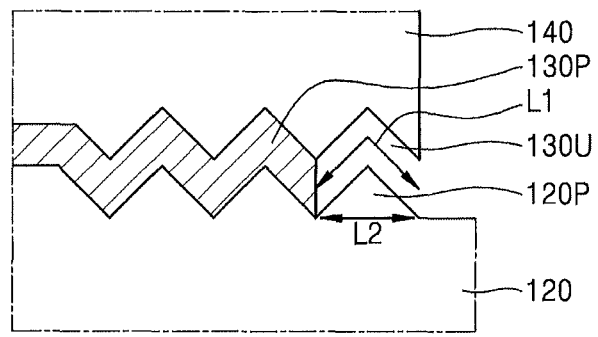

FIG. 8 shows a shape of an undercut 130AU according to a conventional example and a shape of an undercut 130U according to some example embodiments of the present inventive concepts.

(a) of FIG. 8 shows the shape of the undercut 130AU according to a conventional example. In the conventional example, since a pattern having a curved surface is not formed on a seed layer 130A, unlike in the example embodiments of the present inventive concepts, the undercut 130AU may be formed to a predetermined length LA under a pillar layer 140A. When the length LA of the undercut 130AU increases, the pillar layer 140A may be delaminated from electrode pads so that yield may be reduced in a process of forming a bump structure. Also, when a process time for a wet etching process is reduced to reduce the length LA of the undercut 130AU, the seed layer 130A may be unetched in a large number of bump structures.

(b) of FIG. 8 shows the shape of the undercut 130U according to some embodiments of the present inventive concepts and is an enlarged view of a portion C of FIG. 7. In some embodiments, a third pattern 130P may be formed in a portion of a seed layer 130 and may have a curved surface. As described above, the undercut 130U may be formed during a process of wet etching the seed layer 130. Since the wet etching process is an isotropic etching process, an etching process may be performed to the same length for the same process time.

Accordingly, as compared with (a) of FIG. 8, in the same process conditions as process conditions in which the undercut 130AU is formed to a length LA of, for example, about 10 μm, an etch length L1 obtained in the present example embodiments may also be about 10 μm. That is, the total path by which an etching process is performed in the conventional example of (a) of FIG. 8 may be the same as the total path by which an etching process is performed in the present example embodiments of the present inventive concepts, as illustrated in (b) of FIG. 8.

In contrast, in the example embodiments of the present inventive concepts, since the etching is performed along the curved surface of the third pattern 130P, the undercut 13QU formed under the pillar layer 140 may substantially have a length L2. That is, a vertical distance between a sidewall of the pillar layer 140 and a sidewall of the seed layer 130 may correspond to the length L2. For example, when the curved surface of the third pattern 130P has a regular triangular shape, the length L2 of the undercut 130U may be about 5 μm. Accordingly, it can be seen in (b) of FIG. 8 that the undercut 130U according to some embodiments of the present inventive concepts is formed to the length L2 corresponding to half of the length LA of the undercut 130AU according to the conventional example as illustrated in (a) of FIG. 8. That is, the length L2 of the undercut 130U may be less than the total etched length L1.

Figure 9:
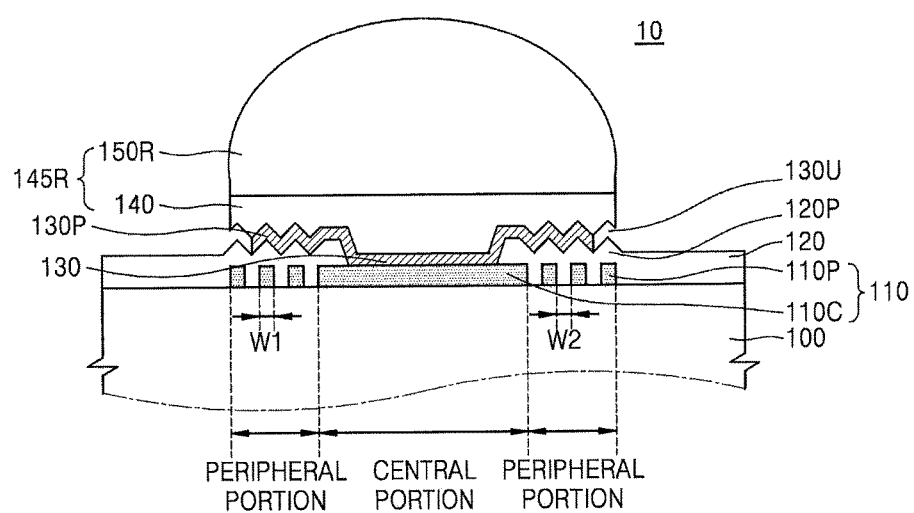

FIG. 9 is a cross-sectional view of a process of forming a semiconductor package 10 by performing a reflow process on the solder layer, for example, solder layer 150 in FIG. 7, according to some embodiments of the present inventive concepts.

A reflow process may be performed by using an annealing process on the semiconductor substrate 100 from which the photoresist pattern, for example, photoresist pattern PR in FIG. 6, and a portion of the seed layer, for example, seed layer 130 in FIG. 6, are removed. The reflow process may be performed at a temperature of about 220° C. to about 260° C. The solder layer 150 may melt due to the reflow process to form a reflow solder layer 150R. The solder layer 150 may melt but not collapse so that the reflow solder layer 150R may be formed on the pillar layer 140 due to surface tension. An intermetallic compound may be formed at an interface between the reflow solder layer 150R and the pillar layer 140. A distance from a center of the reflow solder layer 150R to a side surface of the reflow solder layer 150R may be greater than a distance from a center of the pillar layer 140 to a side surface of the pillar layer 140.

A bump 145R may include the pillar layer 140 and the reflow solder layer 150R. However, the present inventive concepts are not limited thereto. For example, the bump 145R may include only the reflow solder layer 150R. A type of the bump 145R may vary according to a semiconductor package to be manufactured. The bump 145R may function as an external connection terminal and be a point of contact, which may be electrically connected to an external apparatus. The semiconductor package 10 may include a plurality of bumps 145R, although only one bump 145R is illustrated.

In order to embody a high-capacity memory in a limited structure of a semiconductor package, small-sized external connection terminals may be required. Thus, bumps included in the semiconductor package tend to be continuously downscaled. The downscaling of the bumps has led to ever-increasing malfunctions in products due to undercuts. For example, an excessive undercut may weaken bonding strength between a bump and an electrode pad so that the bump may be delaminated from the electrode pad.

The undercuts should be reduced to prevent occurrence of the malfunctions. According to some embodiments of the present inventive concepts, in the semiconductor package 10, an undercut may be formed along a curved surface. Thus, the total length of the path of the etching of the undercut may be the same, but a substantial length of the undercut may be reduced. The semiconductor package 10 according to the example embodiments of the present inventive concepts may reduce malfunctions caused by undercuts or a non-etch phenomenon.

The semiconductor package 10 according to the example embodiments may reduce malfunctions in a process of forming a bump and increase yield. Thus, manufacturing costs may be reduced, and manufacturing efficiency may increase. Furthermore, even if a seed layer is not sufficiently etched, a rework process may be enabled a plurality of times by using an undercut having a smaller length than in the conventional example.

Figure 10:
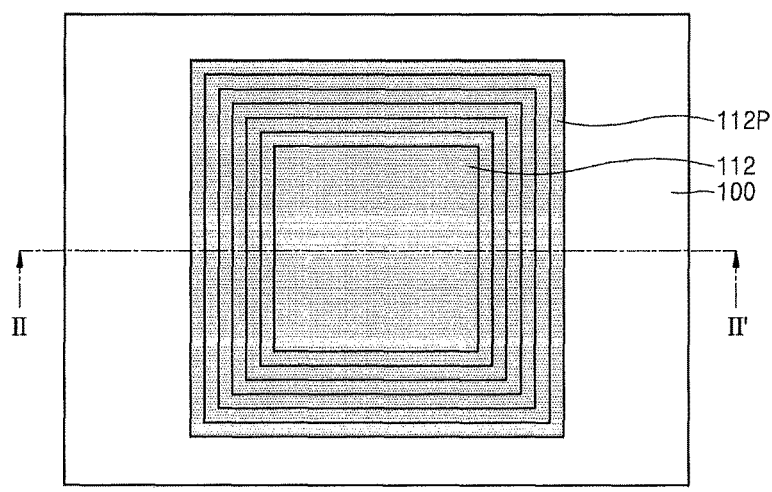
FIGS. 10 and 12 are plan views of an electrode pad included in a semiconductor package according to some example embodiments of the present inventive concepts.
Figure 11:
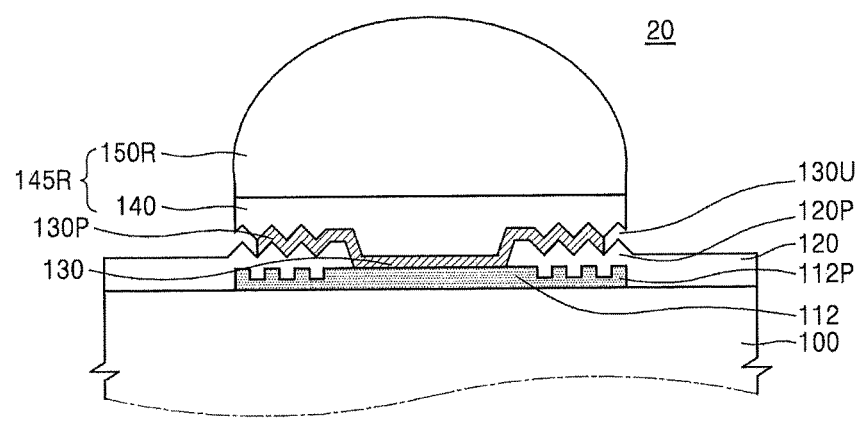
FIGS. 11 and 13 are cross-sectional views of a semiconductor package according to some example embodiments of the present inventive concepts.

FIG. 10 is a plan view and FIG. 11 is a cross-sectional view of a semiconductor package according to some example embodiments of the present inventive concepts.

Specifically, FIG. 10 is a plan view of a semiconductor substrate 100 having an electrode pad 112 according to some example embodiments, and FIG. 11 is a cross-sectional view of a semiconductor package 20 formed on the semiconductor substrate 100. FIG. 11 is a cross-sectional view taken along a line II-II' of FIG. 10 after a semiconductor package manufacturing process is performed.

Referring to FIGS. 10 and 11, in the present example embodiment, the electrode pad 112 having a central portion and a peripheral portion may be formed by using a photolithography process and an etching process. A first pattern 112P may be formed in the peripheral portion and surround the central portion. The first pattern 112P may include a plurality of fine patterns. The first pattern 112P may be formed in the peripheral portion of the electrode pad 112. The first pattern 112P, unlike the first pattern 110P does not expose the substrate 100. That is, the first pattern 112P has a thickness less than a total thickness of the electrode pad 112. By etching only a portion of the electrode pad 112, the first pattern 112P may be electrically connected to the central portion of the electrode pad 112. The electrode pad 112 having the central portion and the peripheral portion having the first pattern 112P may be formed by using known photolithography and etching processes and, thus, detailed descriptions thereof are omitted.

The semiconductor package 20 is the same as the above-described semiconductor package, for example, semiconductor package 10 in FIG. 9, in that a passivation layer 120 having a second pattern 120P, a seed layer 130 having a third pattern 130P, and a bump 145R are formed on the electrode pad 112, and thus detailed descriptions thereof are omitted.

Figure 12:
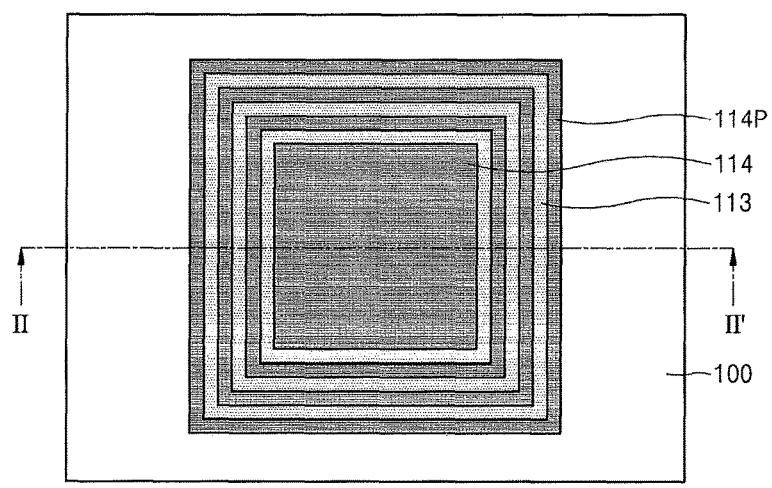
Figure 13:
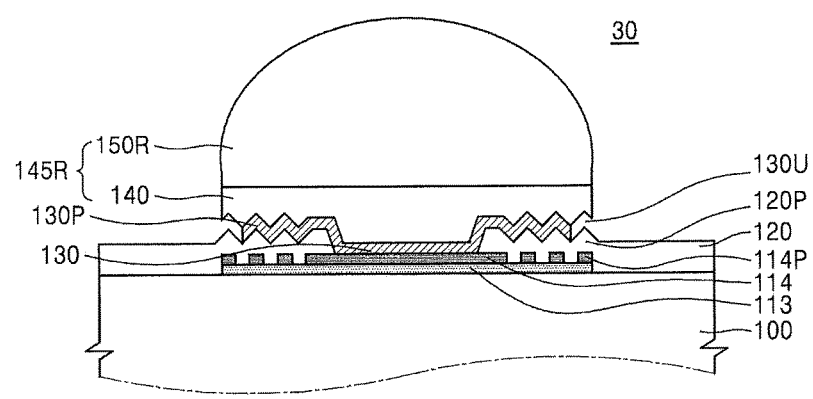

FIG. 12 is a plan view and FIG. 13 is a cross-sectional view of a semiconductor package according to some example embodiments of the present inventive concepts.

Specifically, FIG. 12 is a plan view of a semiconductor substrate 100 including an electrode pad 114 according to some example embodiments, and FIG. 13 is a cross-sectional view of a semiconductor package 30 formed on the semiconductor substrate 100. FIG. 13 is a cross-sectional taken along a line of FIG. 12 after a semiconductor package manufacturing process is performed.

Referring to FIGS. 12 and 13, in the present example embodiment, the electrode pad 114 having a central portion and a peripheral portion may be formed by using a photolithography process and an etching process. An electrode pad under layer 113 including a different material from the electrode pad 114 may be formed under the electrode pad 114. That is, a process of forming an electrode pad including a double layer may be performed. Each of the electrode pad under layer 113 and the electrode pad 114 may include a conductive material. A first pattern 114P may be formed in the peripheral portion of the electrode pad 114 and surround the central portion of the electrode pad 114. The first pattern 114P may include a plurality of fine patterns. The first pattern 114P may be spaced apart from the central portion of the electrode pad 114 and surround the central portion of the electrode pad 114. The first patterns 114P may be spaced apparat from each other and spaced apart from the central portion of the electrode pad 114 and may expose a top surface of the electrode pad under layer 113. The electrode pad 114, the first pattern 114P, and the electrode pad under layer 113 may be electrically connected to one another. The electrode pad 114 having the central portion and the peripheral portion may be formed by using known photolithography and etching processes and, thus, detailed descriptions thereof are omitted.

The semiconductor package 30 is the same as the above-described semiconductor package, for example, semiconductor package 10 in FIG. 9, in that a passivation layer 120 having a second pattern 120P, a seed layer 130 having a third pattern 130P, and a bump 145R are formed on the electrode pad 114, and, thus, detailed descriptions thereof are omitted.

FIGS. 14 to 20 are cross-sectional views of a method of manufacturing a semiconductor package according to some example embodiments of the present inventive concepts.

Figure 14:
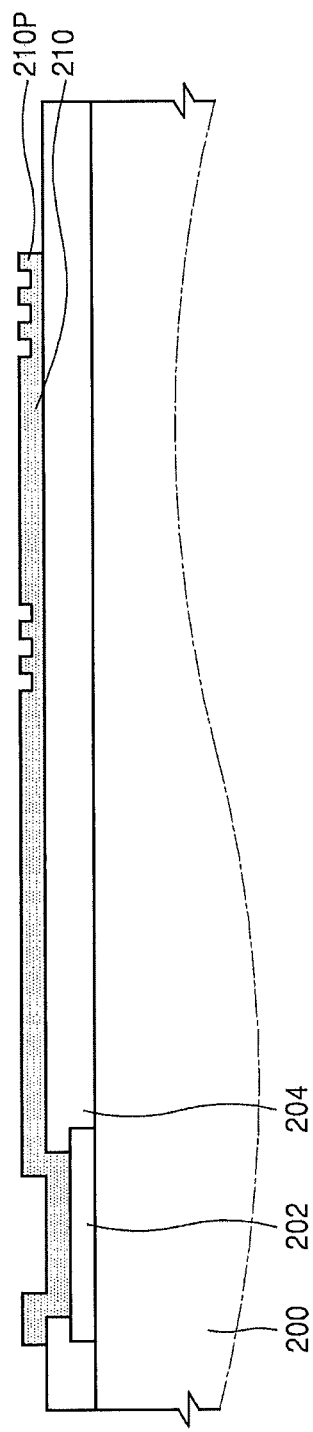
FIGS. 14 to 20 are cross-sectional views illustrating a method of manufacturing a semiconductor package according to some example embodiments of the present inventive concepts.

Referring to FIG. 14, an electrode pad 202 may be formed on a semiconductor substrate 200, and a passivation layer 204 exposing a portion of the electrode pad 202 may be formed. A redistribution 210 may be formed on the electrode pad 202 and the passivation layer 204. The redistribution 210 may be electrically connected to the electrode pad 202 and have a first pattern 210P formed in a region separate, that is, spaced apart, from the electrode pad 202. Materials included in the semiconductor substrate 200, the electrode pad 202, and the passivation layer 204 may be the same as those of the semiconductor package, for example, semiconductor package 10 in FIG. 9.

The redistribution 210 may include, for example, a metal. For example, the redistribution 210 may include copper (Cu), nickel (Ni), gold (Au), chromium (Cr), titanium (Ti), palladium (Pd) or an alloy thereof. The redistribution 210 may be formed by using an electroplating process. The first pattern 210P may be formed in a portion of the redistribution 210 by using a photolithography process and an etching process.

Figure 15:
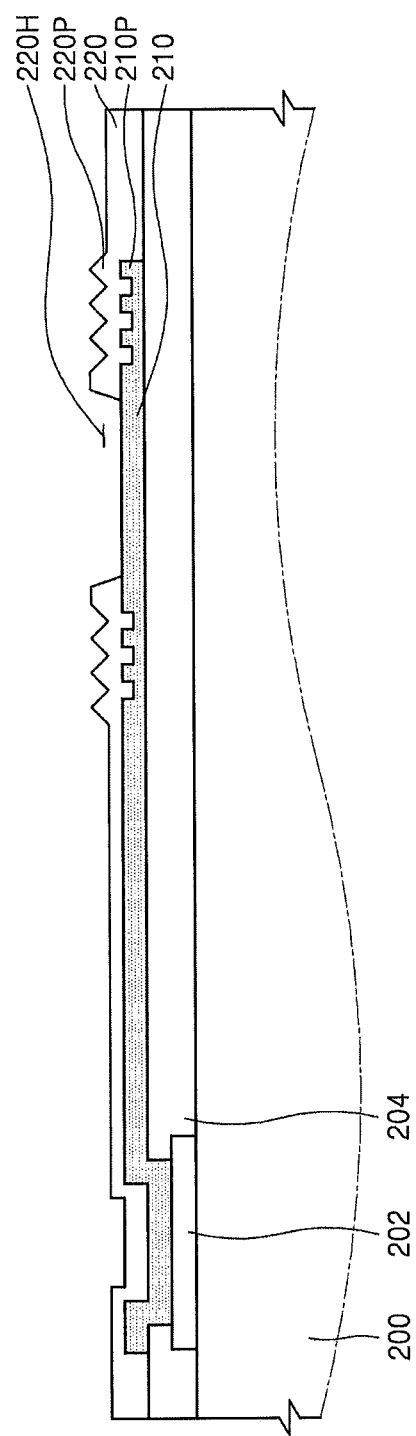

Referring to FIG. 15, an insulating layer 220 may be formed on the redistribution 210 and the passivation layer 204. The insulating layer 220 may include an opening 220H and a second pattern 220P. The opening 220H may expose a portion of the redistribution 210. The second pattern 220P of the insulating layer 220 may be formed on the first pattern 210P of the redistribution 210.

The opening 220H may have the same size as a typical ball land. Since the redistribution 210 according to the present example embodiment includes the first pattern 210P, the insulating layer 220 may have the second pattern 220P formed along a top profile of the first pattern 210P.

The opening 220H in the insulating layer 220 may be surrounded by the second pattern 220P of the insulating layer 220. That is, during the process of forming the insulating layer 220, the insulating layer 220 may be formed such that the opening 220H may expose the portion of the redistribution 210 and be surrounded by the second pattern 220P.

The insulating layer 220 may be formed such that the redistribution 210 is insulated in all regions except for in the opening 220H. The insulating layer 220 may have a multi-layered structure.

In the present example embodiment, since the insulating layer 220 includes the second pattern 120P, the insulating layer 220 may include, for example, a silicon oxide layer or a silicon nitride layer. A silicon-based insulating layer may have good insulating characteristics and be formed based on a shape of an underlying layer. Accordingly, the insulating layer 220 may have the second pattern 220P having a shape corresponding to a shape of the first pattern 210P. A profile of the second pattern 220P may be substantially the same as or approximately similar to a profile of the first pattern 210P. A shape of the second pattern 220P may vary according to materials, process conditions, and subsequent processes.

Figure 16:
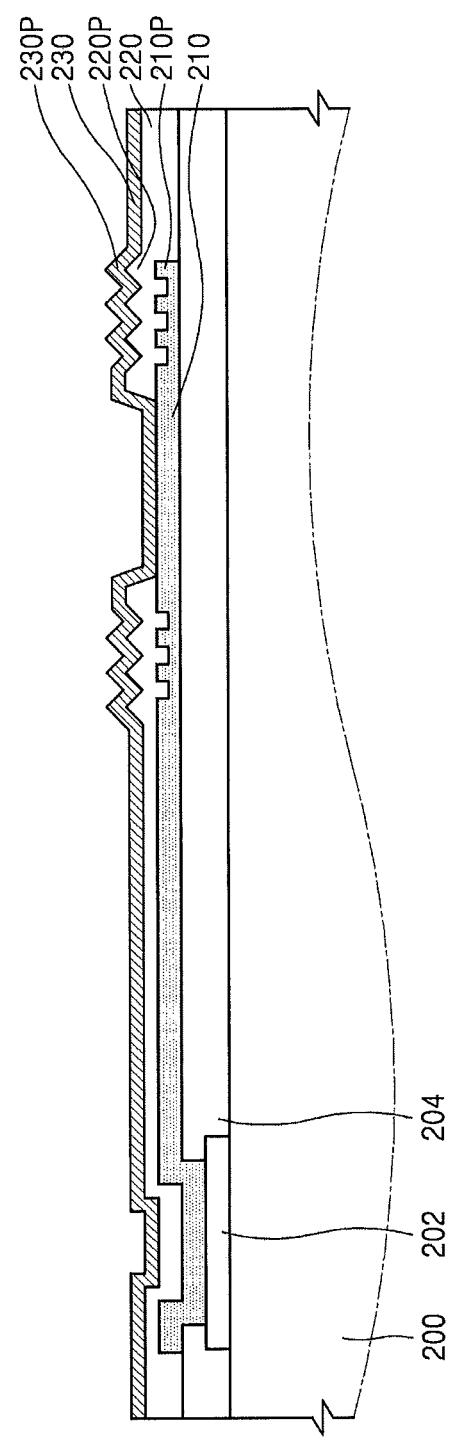

Referring to FIG. 16, the seed layer 230 may include a third pattern 230P formed on the second pattern 220P of the insulating layer 220. A top surface of the third pattern 230P may have substantially the same profile as a top surface of the second pattern 220P. Also, the seed layer 230 may substantially planarly cover the entire opening 220H of the insulating layer 220. That is, the third pattern 230P may not be formed on a region in contact with the redistribution 210. Thus, the third pattern 230P surrounds the opening 220H and does not contact the exposed portion of the redistribution 210 exposed through opening 220H.

Since the seed layer 230 is formed by using the same material and formation process as the seed layer 130 of the semiconductor package 10 of FIG. 9, detailed descriptions thereof are omitted.

Figure 17:
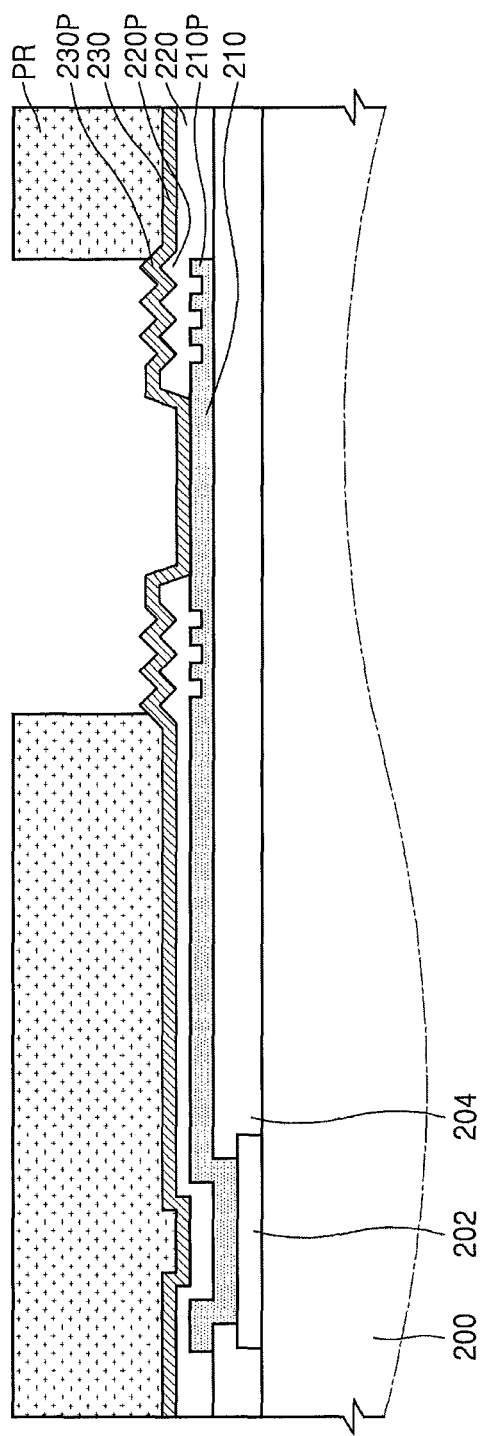

Referring to FIG. 17, a photoresist pattern PR may be formed on the seed layer 230. The photoresist pattern PR may expose a portion of the seed layer 230.

The exposed portion of the seed layer 230 may include a portion of the seed layer 230, which is in contact with the redistribution 210, and the third pattern 230P. That is, the substantially planar portion of the seed layer 230 covering the opening 220H of the insulating layer 220 and the third pattern 230P are exposed by the photoresist PR. Since a portion, that is, a ball land, of the seed layer 230 exposed by the photoresist pattern PR corresponds to a portion in which a bump structure, for example, bump structure 245 in FIG. 18, will be formed in a subsequent process, when a plurality of redistributions 210 are formed, a plurality of portions may be exposed by the photoresist pattern PR which correspond to the respective redistributions 210.

Figure 18:
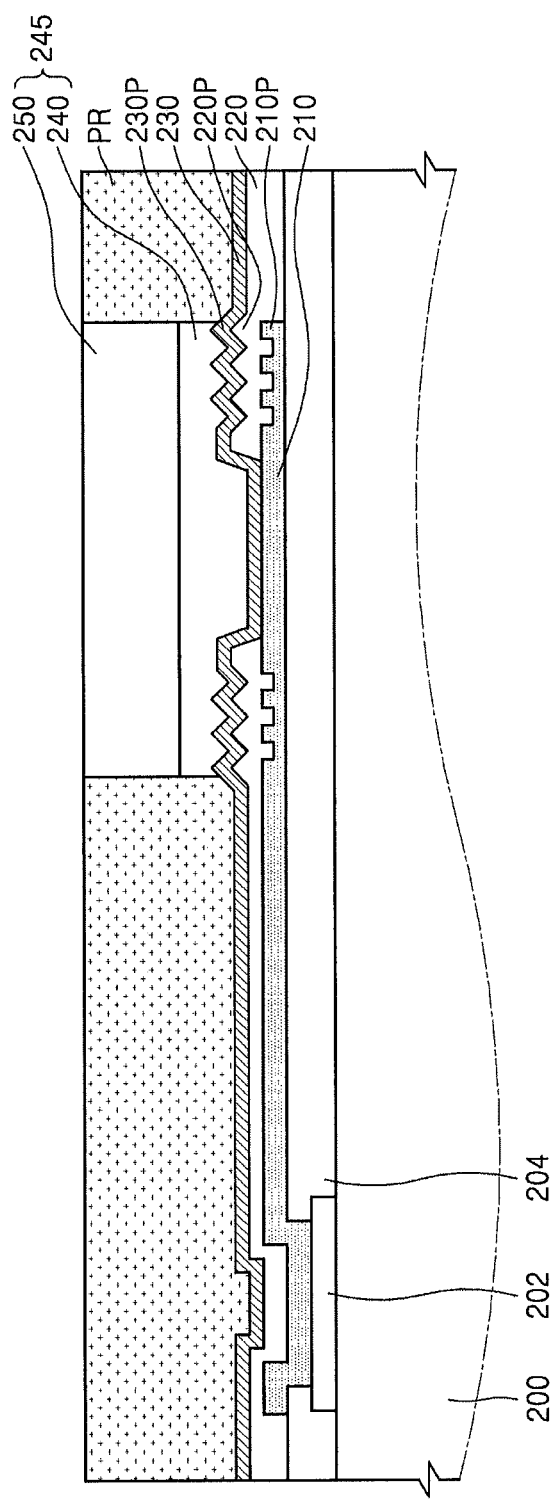

Referring to FIG. 18, a double structure including a pillar layer 240 and a solder layer 250 may be formed on the seed layer 230 on which the photoresist pattern PR is formed. However, the present inventive concepts are not limited thereto. For example, a single structure including a solder layer 250 may be formed on the seed layer 230 on which the photoresist pattern PR is formed. The pillar layer 240 and the solder layer 250 may form bump structure 245.

A thickness of a portion of the pillar layer 240 formed on a region of the seed layer 230 in contact with the redistribution 210 may be different from a thickness of a portion of the pillar layer 240 formed on the third pattern 230P of the seed layer 230. A bottom surface of the pillar layer 240 may have a shape corresponding to a top profile of the third pattern 230P along the third pattern 230P and a shape corresponding to a top profile of the seed layer 230 in opening 220H along the opening 220H. In contrast, a top surface of the pillar layer 240 may be a flat surface.

Since the pillar layer 240 and the solder layer 250 are formed by using the same materials and formation processes as the pillar layer, for example, pillar layer 140 in FIG. 7, and the solder layer, for example, solder layer 150 in FIG. 7, as described above, detailed descriptions thereof are omitted.

Figure 19:
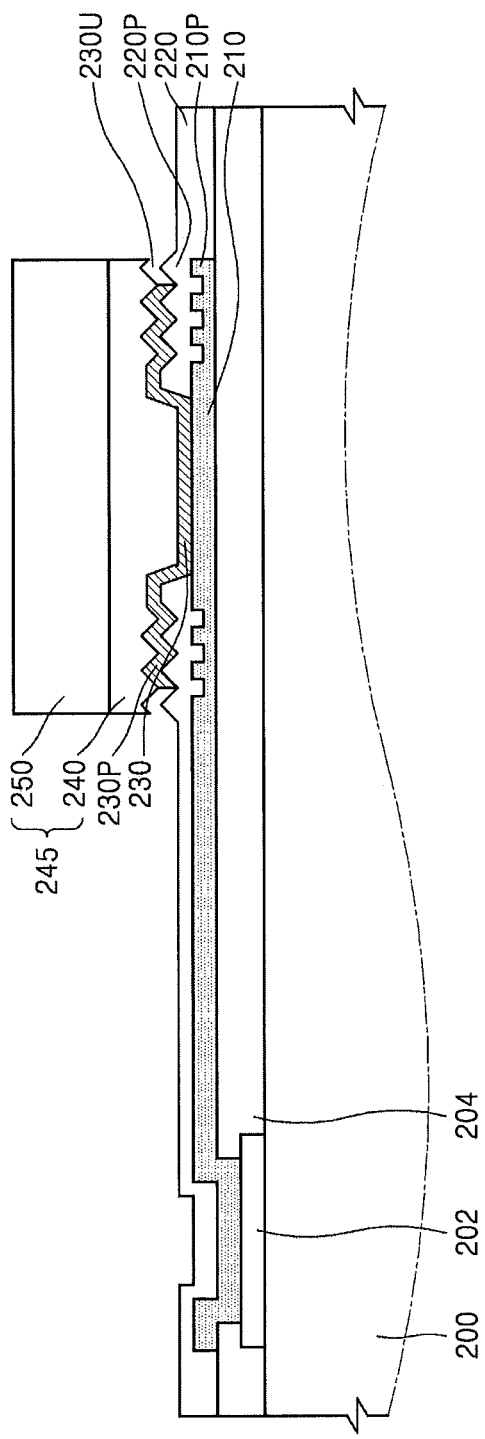

Referring to FIG. 19, the photoresist pattern, for example, photoresist pattern PR in FIG. 18, may be removed, and a portion of the seed layer 230 may be removed. For example, the portion of the seed layer 230 under the photoresist pattern PR and a portion of the seed layer 230 under the pillar layer 240, that is undercut 230U, may be removed.

The photoresist pattern PR may be removed by using, for example, a strip process or an ashing process. After the photoresist pattern PR is removed, the exposed seed layer 230 may be wet etched by using the pillar layer 240 and the solder layer 250 as an etch mask. When the seed layer 230 is wet etched by using an isotropic etching process, the undercut 230U may be formed in a lower portion of the pillar layer 240.

The undercut 230U may be formed under the bump structure 245 by etching a side surface of the seed layer 230. The undercut 230U may extend under the bump structure 245 to a length of about several μm, for example, more than 2 μm. Since the undercut 230U is formed by removing a portion of the third pattern 230P under the pillar layer 240, the undercut 230U may have the same shape as the third pattern 230P. That is, the undercut 230U may have a curved surface unlike the undercut 130AU of (a) of FIG. 8 according to the conventional example.

Since the wet etching process is substantially the same as the wet etching process for manufacturing the semiconductor package, for example, semiconductor package 10 in FIG. 9, detailed descriptions thereof are omitted.

Figure 20:
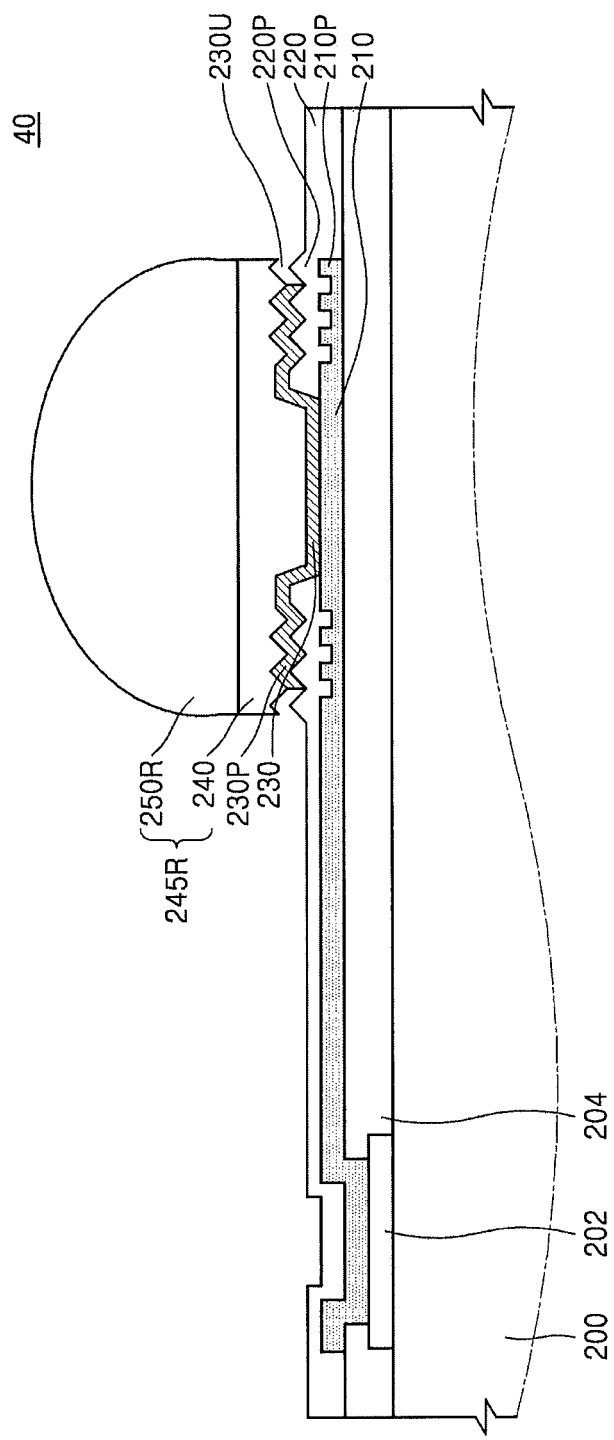

FIG. 20 is a cross-sectional view of a process of forming a semiconductor package 40 by performing a reflow process on the solder layer, for example, solder layer 250 in FIG. 19, according to some example embodiments of the present inventive concepts.

By melting the solder layer 250 due to a reflow process, a reflow solder layer 250R may be formed. A bump 245R may include the pillar layer 240 and the reflow solder layer 250R, However, the present inventive concepts are not limited thereto. For example, the bump 245R may include only the reflow solder layer 250R. A type of the bump 245R may vary according to a semiconductor package to be manufactured. The bump 245R may function as an external connection terminal and be a point of contact, which may be electrically connected to an external apparatus. Although the semiconductor package 40 may include a plurality of bumps 245R, only one bump 245R is illustrated in FIG. 20.

In a semiconductor package, for example, a wafer-level package, a redistribution may be formed on an electrode pad so that an external connection terminal may be located on the surface of a semiconductor substrate, and a position of the electrode pad may be different from a position of the external connection terminal by using the redistribution.

During a process of forming a bump on the redistribution, an undercut may occur and bonding strength of the bump may be degraded causing malfunctions. Thus, by forming a pattern capable of minimizing undercuts as in the example embodiments of the present inventive concepts, process malfunctions may be reduced to increase yield. As a result, manufacturing costs may be reduced, and manufacturing efficiency may increase.

Figure 21:
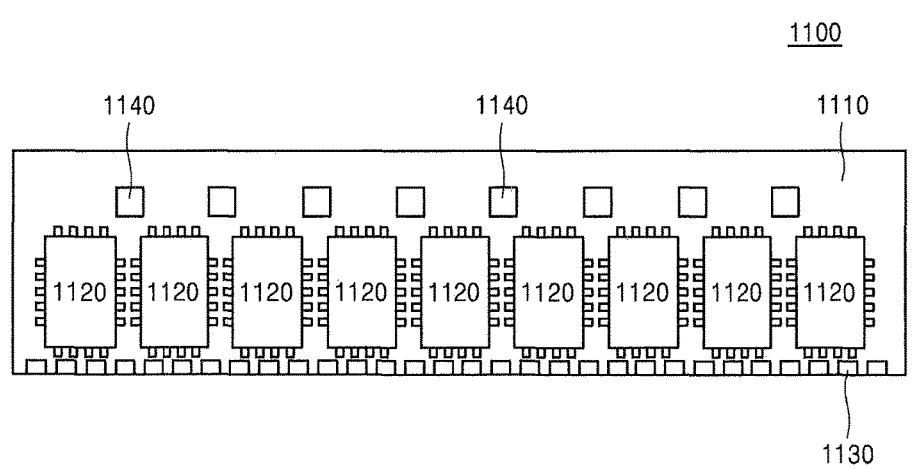
FIG. 21 is a plan view of a memory module including a semiconductor package according to some example embodiments of the present inventive concepts.

FIG. 21 is a plan view of a memory module 1100 including a semiconductor package according to some example embodiments of the present inventive concepts.

Referring to FIG. 21, the memory module 1100 may include a module substrate 1110 and a plurality of semiconductor packages 1120 adhered to the module substrate 1110.

The plurality of semiconductor packages 1120 may include a semiconductor package according to the example embodiments of the present inventive concepts. That is, the plurality of semiconductor packages 1120 may include at least one of the semiconductor packages 10, 20, 30, and 40 illustrated in connection with FIGS. 9, 11, 13, and/or 20.

A connector 1130 may be located on one side of the module substrate 1110 and inserted into a socket of a mainboard. A ceramic decoupling capacitor 1140 may be located on the module substrate 1110. The memory module 1100 according to the present example embodiments is not limited to the construction shown in FIG. 21 but may be manufactured in various forms.

Figure 22:
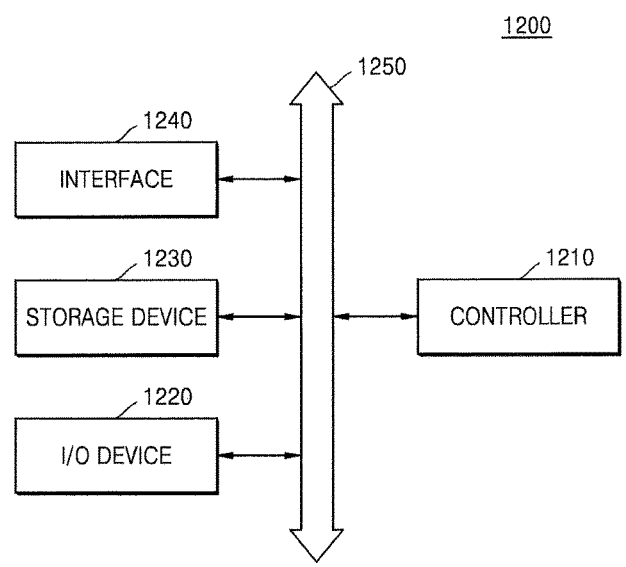
FIG. 22 is a block diagram of a system including a semiconductor package according to some example embodiments of the present inventive concepts.

FIG. 22 is a block diagram of a system 1200 including a semiconductor package according to some example embodiments of the present inventive concepts.

Referring to FIG. 22, the system 1200 may include a controller 1210, an I/O device 1220, a storage device 1230, an interface 1240 and a bus 1250.

The system 1200 may be, for example, a mobile system or a system configured to transmit or receive information. In some embodiments, the mobile system may be a personal digital assistant (PDA), a portable computer, a web tablet, a wireless phone, a mobile phone, a digital music player, a memory card, or the like.

The controller 1210 may be configured to control an execution program in the system 1200. The controller 1210 may include, for example, a microprocessor (MP), a digital signal processor (DSP), a microcontroller (MC), or a device similar thereto.

The I/O device 1220 may be used to input or output data to the system 1200. The system 1200 may be connected to an external apparatus, for example, a personal computer (PC) or a network) by using the I/O device 1220 and exchange data with the external apparatus. The I/O device 1220 may be, for example, a keypad, a keyboard, a display, or the like.

The storage device 1230 may store codes and/or data for operations of the controller 1210 or store data processed by the controller 1210. The storage device 1230 may include a semiconductor package according to some embodiments of the present inventive concepts. That is, the storage device 1230 may include at least one of the semiconductor packages 10, 20, 30, and 40 illustrated in connection with FIGS. 9, 11, 13, and/or 20.

The interface 1240 may be a data transmission path between the system 1200 and another external apparatus. The controller 1210, the I/O device 1220, the storage device 1230, and the interface 1240 may communicate with one another via the bus 1250.

The system 1200 may be used for, for example, a mobile phone, a MPEG-1 audio layer 3 (MP3) player, a navigation, a portable multimedia player (PMP), a solid-state disk (SSD), household appliances, or the like.

Figure 23:
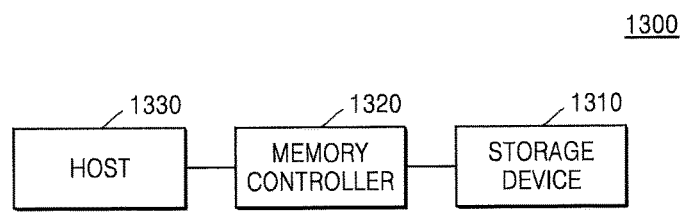
FIG. 23 is a block diagram of a memory card including a semiconductor package according to some example embodiments of the present inventive concepts.

FIG. 23 is a block diagram of a memory card 1300 including a semiconductor package according to some example embodiments of the present inventive concepts.

Referring to FIG. 23, the memory card 1300 may include, for example, a storage device 1310 and a memory controller 1320.

The storage device 1310 may store data. In some embodiments, the storage device 1310 may have non-volatile characteristics and retain stored data even if a power supply is interrupted. The storage device 1310 may include a semiconductor package according to the example embodiments of the present inventive concepts. That is, the storage device 1310 may include at least one of the semiconductor packages 10, 20, 30, and 40 illustrated in connection with FIGS. 9, 11, 13, and/or 20.

The memory controller 1320 may read data stored in the storage device 1310 or store data in the storage device 1310 in response to read/write requests from a host 1330.

While the present inventive concepts have been particularly shown and described with reference to example embodiments thereof, it will be understood that various changes in form and details may be made therein without departing from the spirit and scope of the following claims.

What is claimed is:

1. A semiconductor package comprising:
   a semiconductor substrate;
   an electrode pad on the semiconductor substrate and including a central portion and a peripheral portion, wherein a first pattern is located on the peripheral portion;
   a passivation layer on the semiconductor substrate and the electrode pad, the passivation layer having an opening exposing the central portion of the electrode pad and a second pattern located on the first pattern;
   a seed layer on the electrode pad and the passivation layer and having a third pattern on the second pattern; and
   a bump on the seed layer and electrically connected to the electrode pad,
   wherein an undercut is formed in the third pattern located under an edge of a lower portion of the bump,
   wherein the bump comprises a pillar layer being in contact with the seed layer and a solder layer on the pillar layer,
   wherein a top surface of the pillar layer extending over the central portion and the peripheral portion is a flat surface, and
   wherein, in an area where the second pattern of the passivation layer is formed, a level of an uppermost surface of the passivation layer is lower than a level of a lowermost surface of the pillar layer, and top and bottom surfaces of the undercut are curved surfaces.

2. The semiconductor package of claim 1, wherein a bottom surface of the pillar layer is a curved surface corresponding to the third pattern.

3. The semiconductor package of claim 1, wherein a distance from a center of the pillar layer to a side surface of the pillar layer is greater than a distance from a center of the seed layer to a side surface of the seed layer.

4. The semiconductor package of claim 1, wherein, in the electrode pad, the first pattern is spaced apart from the central portion and surrounds the central portion, and
   a top surface of the first pattern is at a same level as a top surface of the central portion.

5. The semiconductor package of claim 4, wherein the first pattern comprises a plurality of isolated fine patterns, a width of each of the fine patterns is substantially equal to a distance between the fine patterns.

6. The semiconductor package of claim 1, wherein, in the electrode pad, the first pattern is connected to the central portion, and
   a top surface of the first pattern is a curved surface.

7. The semiconductor package of claim 1, wherein the second pattern has a shape corresponding to the first pattern, and
   the third pattern has a shape corresponding to the second pattern.

8. The semiconductor package of claim 1, wherein, in the passivation layer, the opening is surrounded by the second pattern.

9. The semiconductor package of claim 1, wherein the passivation layer is a silicon oxide layer or a silicon nitride layer.

* * * * *